United States Patent
Echigo et al.

(10) Patent No.: US 7,956,293 B2
(45) Date of Patent: Jun. 7, 2011

(54) MULTILAYER PRINTED WIRING BOARD AND MANUFACTURING METHOD THEREOF

(75) Inventors: Fumio Echigo, Osaka (JP); Shogo Hirai, Osaka (JP); Tadashi Nakamura, Osaka (JP)

(73) Assignee: Panasonic Corporation, Osaka (JP)

( * ) Notice: Subject to any disclaimer, the term of this patent is extended or adjusted under 35 U.S.C. 154(b) by 298 days.

(21) Appl. No.: 11/910,560

(22) PCT Filed: Apr. 2, 2007

(86) PCT No.: PCT/JP2007/057394
§ 371 (c)(1),
(2), (4) Date: Oct. 3, 2007

(87) PCT Pub. No.: WO2007/116855
PCT Pub. Date: Oct. 18, 2007

(65) Prior Publication Data
US 2009/0139761 A1 Jun. 4, 2009

(30) Foreign Application Priority Data

Apr. 3, 2006 (JP) ................. 2006-101749
Apr. 3, 2006 (JP) ................. 2006-101750

(51) Int. Cl.
H05K 1/11 (2006.01)
(52) U.S. Cl. ...................... 174/264; 174/262

(58) Field of Classification Search .......... 174/262–267; 361/792–795
See application file for complete search history.

(56) References Cited

U.S. PATENT DOCUMENTS

| | | | | |
|---|---|---|---|---|
| 6,010,769 | A * | 1/2000 | Sasaoka et al. | 428/209 |
| 7,312,400 | B2 * | 12/2007 | Ito et al. | 174/250 |
| 2004/0231151 | A1 * | 11/2004 | Nakatani et al. | 29/830 |

FOREIGN PATENT DOCUMENTS

| | | |
|---|---|---|
| JP | 59-175796 | 10/1984 |
| JP | 2001-094256 A | 4/2001 |
| JP | 2003-198086 A | 7/2003 |

OTHER PUBLICATIONS

Japanese Search Report for Application No. PCT/JP2007/057394, dated Jun. 26, 2007.

* cited by examiner

*Primary Examiner* — Ishwarbhai B Patel
(74) *Attorney, Agent, or Firm* — RatnerPrestia

(57) ABSTRACT

A multilayer printed wiring board is characterized in that the interlayer connection material in the via holes has a lower coefficient of thermal expansion in the thickness direction than the electrically insulating substrate made of insulating material; the interlayer connection is formed at a temperature higher than the operating temperature; and the interlayer connection material is larger in thickness than the interlayer connection material of the same wiring layer at normal temperature. This causes a difference in the coefficient of thermal expansion between the different materials in the thickness direction of the printed wiring board in the environment in which it is used resulting in high connection reliability.

7 Claims, 2 Drawing Sheets

MULTILAYER PRINTED WIRING BOARD AND MANUFACTURING METHOD THEREOF

This application is a U.S. national phase application of PCT international application PCT/JP2007/057394.

TECHNICAL FIELD

The present invention relates to a multilayer printed wiring board in which an interlayer connection is formed via inner via holes, and to a manufacturing method thereof.

BACKGROUND ART

In recent years, as electronic devices are becoming smaller and higher performing, there is a growing demand for providing inexpensive multilayer wiring boards that mount semiconductor chips such as LSIs at high density not only for industrial use but also for consumer use. Such multilayer wiring boards are required to electrically connect a plurality of fine pitch wiring patterns at high connection reliability.

To meet the market request, there have been proposed multilayer printed wiring boards having an interstitial via hole structure (hereinafter, IVH structure), which is easy to achieve high density wiring.

A multilayer printed wiring board having the IVH structure includes interlayer dielectric layers forming a laminated body, and via holes and through holes made of electroless plating and electroplating. The via holes electrically connect inner layer conductor circuit patterns or between inner layer conductor circuit patterns and outer layer conductor circuit patterns. The through holes connect outermost layer conductor patterns.

One of the prior arts related to the present invention is Patent Document 1 shown below.

In conventional multilayer printed wiring boards, however, the difference in the coefficient of thermal expansion between insulating material and intercalating metal causes an internal stress, which may lead to breakage of plated through holes or plated via holes especially in a substrate having a thickness of 1 mm or more. Interlayer connection is formed at a temperature of 20 to 60° C. by plating and reaches its fatigue limits due to high temperature environment or cold heat stress. It has been tried to reduce the difference in the coefficient of thermal expansion by filling the insulating resin with an inorganic filler. It is, however, difficult to make the coefficient of thermal expansion of the insulating resin lower than that of the interlayer connection material.

Patent Document 1: Japanese Patent Unexamined Publication No. 59-175796

SUMMARY OF THE INVENTION

In the multilayer printed wiring board of the present invention, when interlayer connection material has a coefficient of thermal expansion in a thickness direction lower than that of an electrically insulating substrate made of insulating material in the thickness direction, an interlayer connection of the interlayer connection material is formed at a temperature higher than the operating temperature, and the interlayer connection material is larger than the insulating material of the same wiring layer at the operating temperature in thickness.

This structure allows interlayer connection material having a lower coefficient of thermal expansion in the thickness direction than insulating material to be formed in a via hole, which is formed at a temperature higher than the operating temperature. This causes a difference in the coefficient of thermal expansion between the different materials in the thickness direction of the printed wiring board in the environment in which it is used. As a result, the internal stress always functions to contract the interlayer connecting portion. Contracting the interlayer connecting portion in this manner achieves a multilayer printed wiring board having high connection reliability.

The method for manufacturing a multilayer printed wiring board of the present invention includes: forming a via hole in insulating material; forming interlayer connection material in the via hole, the interlayer connection material having a coefficient of thermal expansion in the thickness direction lower than the insulating material; and forming interlayer connection at a temperature higher than the operating temperature of the multilayer printed wiring board, the interlayer connection being larger than the insulating material of a same wiring layer at the operating temperature in thickness.

According to the present invention, the interlayer connection material having a coefficient of thermal expansion in the thickness direction lower than the insulating material is formed in the via hole, and the interlayer connection is formed at a temperature higher than the operating temperature of the multilayer printed wiring board, the interlayer connection being larger than the insulating material of a same wiring layer at the operating temperature in thickness.

This causes a difference in the coefficient of thermal expansion between the different materials in the thickness direction of the printed wiring board in the environment in which it is used. As a result, the internal stress always functions to contract the interlayer connecting portion. Contracting the interlayer connecting portion in this manner achieves a multilayer printed wiring board having high connection reliability.

REFERENCE MARKS IN THE DRAWINGS

Figure 1:
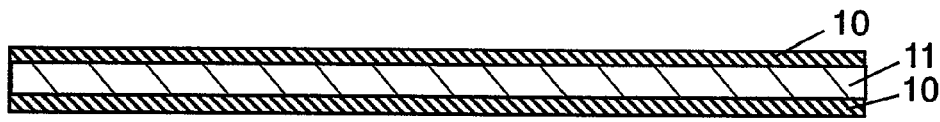
FIG. 1 is a sectional view showing a step of pasting protective films to an electrically insulating substrate of a method for manufacturing a multilayer printed wiring board according to a first embodiment of the present invention.

10 protective film
11 electrically insulating substrate
12 via hole
13 interlayer connection material
14 wiring member
15 double-sided wiring board
16 multilayer printed wiring board

DETAILED DESCRIPTION OF PREFERRED EMBODIMENT

An embodiment of the present invention is described as follows with reference to drawings.

First Embodiment

FIGS. 1 to 9 are sectional views showing steps of the method for manufacturing a multilayer printed wiring board according to a first embodiment of the present invention. FIG. 1 is a sectional view showing a step of pasting protective films 10 to electrically insulating substrate 11 according to the first embodiment. First, as shown in FIG. 1, protective films 10 are laminated on both sides of electrically insulating substrate 11, which has a planar shape and made of insulating material (whose coefficient of thermal expansion is 40 to 70 ppm/° C.). The insulating material is a composite of glass woven cloth and thermosetting resin such as epoxy-based resin.

Figure 2:
FIG. 2 is a sectional view showing a step of forming via holes of the method for manufacturing a multilayer printed wiring board according to the first embodiment of the present invention.

In the next step, via holes 12 are formed. FIG. 2 is a sectional view showing a step of forming via holes. As shown in FIG. 2, via holes 12, which penetrate through electrically insulating substrate 11 and protective films 10, are formed by laser drilling or the like.

Figure 3:
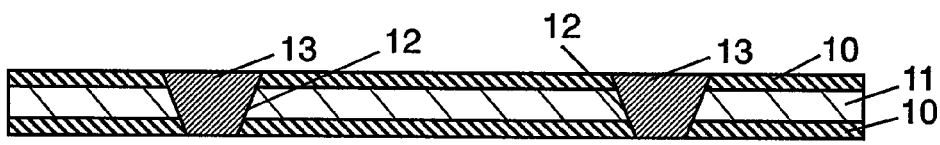
FIG. 3 is a sectional view showing a step of forming interlayer connection material in the via holes of the method for manufacturing a multilayer printed wiring board according to the first embodiment of the present invention.

In the next step, interlayer connection material 13 is formed. FIG. 3 is a sectional view showing a step of forming interlayer connection material 13 in via holes 12. As shown in FIG. 3, interlayer connection material 13 (whose coefficient of thermal expansion is 16 to 35 ppm/° C.) is formed in via holes 12. Interlayer connection material 13 is made of conductive paste having a coefficient of thermal expansion in the thickness direction lower than that of the insulating material forming electrically insulating substrate 11. The interlayer connection is made at a temperature of 180 to 400° C. using interlayer connection material 13.

Figure 4:
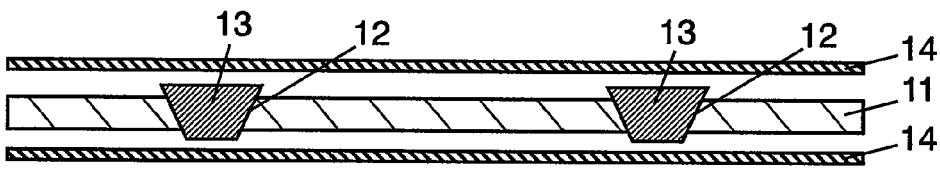
FIG. 4 is a sectional view showing a step of laminating wiring members of the method for manufacturing a multilayer printed wiring board according to the first embodiment of the present invention.

FIG. 4 is a sectional view showing a step of laminating wiring members 14. First, protective films 10 at both sides of electrically insulating substrate 11 shown in FIG. 3 are removed. Then, as shown in FIG. 4, foil-like wiring members 14 containing, for example, copper is laminated on both sides of electrically insulating substrate 11.

Figure 5:
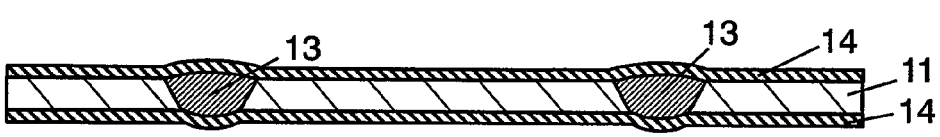
FIG. 5 is a sectional view showing a step of bonding the wiring members to the electrically insulating substrate and the interlayer connection material of the method for manufacturing a multilayer printed wiring board according to the first embodiment of the present invention.

In the next step, wiring members 14 are heated and pressurized. FIG. 5 is a sectional view showing a step of bonding wiring members 14 to electrically insulating substrate 11 and interlayer connection material 13. As shown in FIG. 5, wiring members 14 are heated and pressurized at 180 to 200° C. and at 3 to 5 MPa so as to be bonded to electrically insulating substrate 11 and interlayer connection material 13. In this heating and pressurizing step, interlayer connection material 13 is contracted in the thickness direction, and at the same time, wiring members 14 and interlayer connection material 13 are electrically connected to each other.

Electrically insulating substrate 11 and interlayer connection material 13 that have wiring members 14 bonded thereto is cooled after the heating and pressurizing step. This causes a difference in the coefficient of thermal expansion between the different materials in the thickness direction. As a result, the internal stress allows interlayer connection material 13 to contract, thereby improving connection reliability in via holes 12.

Figure 6:
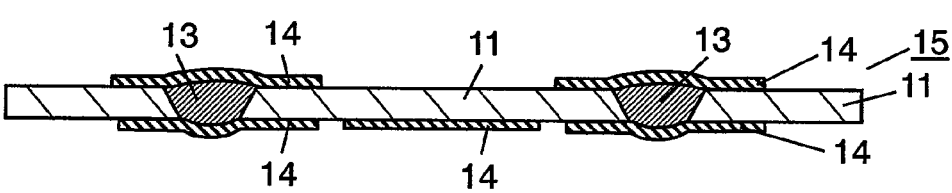
FIG. 6 is a sectional view showing a step of patterning the wiring members of the method for manufacturing a multilayer printed wiring board according to the first embodiment of the present invention.

In the next step, wiring members 14 are patterned. FIG. 6 is a sectional view showing a step of patterning wiring members 14. As shown in FIG. 6, wiring members 14 are patterned to complete double-sided wiring board 15. The patterning can be performed, for example, by etching.

Figure 7:
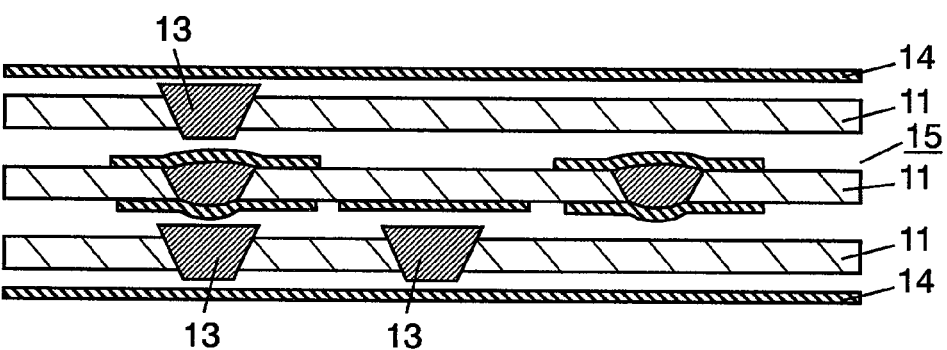
FIG. 7 is a sectional view showing a step of laminating the wiring members and electrically insulating substrates which are filled with the interlayer connection material of the method for manufacturing a multilayer printed wiring board according to the first embodiment of the present invention.

In the next step, a plurality of wiring boards are laminated. FIG. 7 is a sectional view showing a step of laminating wiring members 14 and electrically insulating substrates 11 which are filled with interlayer connection material 13. As shown in FIG. 7, electrically insulating substrates 11, which are formed in the same steps as FIGS. 1 to 4 and each filled with interlayer connection material 13 are laminated on both sides of double-sided wiring board 15. Then, two more wiring members 14 are laminated on both sides thereof.

Figure 8:
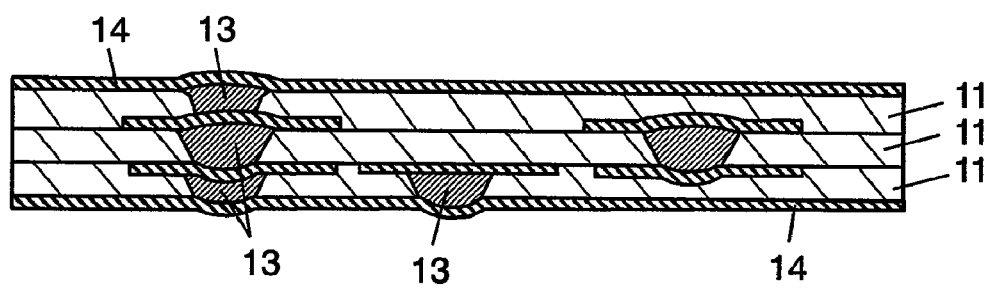
FIG. 8 is a sectional view showing a step of heating and pressurizing the wiring members of the method for manufacturing a multilayer printed wiring board according to the first embodiment of the present invention.

In the next step, the wiring boards thus laminated are heated and pressurized. FIG. 8 is a sectional view showing a step of heating and pressurizing wiring members 14. As shown in FIG. 8, wiring members 14 are heated and pressurized, which may be performed in the same manner as in the step shown in FIG. 5.

In the same manner as in FIG. 5, the wiring boards thus laminated are cooled after the heating and pressurizing step. This causes a difference in the coefficient of thermal expansion between the different materials in the thickness direction. As a result, the internal stress allows interlayer connection material 13 to contract, thereby improving connection reliability in via holes 12.

Figure 9:
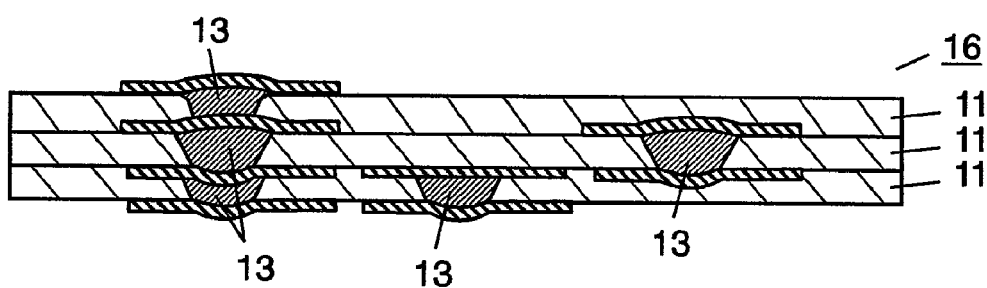
FIG. 9 is a sectional view showing a step of patterning the wiring members of the method for manufacturing a multilayer printed wiring board according to the first embodiment of the present invention.

In the next step, wiring members 14 are patterned. FIG. 9 is a sectional view showing a step of patterning wiring members 14. As shown in FIG. 9, wiring members 14 disposed on the outermost surfaces are patterned to complete multilayer printed wiring board 16 shown in FIG. 9. The patterning can be performed, for example, by etching. At normal temperature, interlayer connection material 13 of multilayer printed wiring board 16 is larger in thickness than electrically insulating substrate 11 which is made of the insulating material and formed in the same wiring layer as interlayer connection material 13.

In the embodiment, the multilayer printed wiring board is a four-layer wiring board; however, the number of the wiring layers in the multilayer printed wiring board is not limited to four. The multilayer printed wiring board has at least two wiring layers and may have five or more wiring layers laminated by the similar steps.

Multilayer printed wiring board 16 completed through the aforementioned steps is used at a temperature lower than the heating temperature used in the step of heating and pressurizing wiring members 14 shown in FIG. 5. The temperature at which multilayer printed wiring board 16 is used is, for example, 60° C. This causes a difference in the coefficient of thermal expansion between the different materials in the thickness direction. As a result, the internal stress always functions to contract interlayer connecting material 13, thereby improving connection reliability in via holes 12.

In the present embodiment, the insulating material is a composite of glass woven cloth and epoxy-based resin. Alternatively, it may be a composite of either glass unwoven cloth, aramid woven cloth, or aramid unwoven cloth and thermosetting resin such as epoxy-based resin. Alternatively, it may be a composite of either glass woven cloth, glass unwoven cloth, aramid woven cloth, or aramid unwoven cloth and thermoplastic resin whose glass transition temperature is 180° C. or above. Alternatively, the insulating material may be made of a film material. Examples of the thermoplastic resin whose glass transition temperature is 180° C. or above include wholly aromatic polyester resin, polyethersulfone, polyether ketone, and polyetheretherketone.

Interlayer connection material 13 is formed by filling via holes 12 with the conductive paste. Alternatively, as long as the temperature to form the connection is higher than the operating temperature, interlayer connection material 13 may be formed in via holes 12 by filled plating, conformal plating, evaporating, or sputtering.

As described hereinbefore, according to the present embodiment, the interlayer connection material in the via holes has a coefficient of thermal expansion in the thickness direction lower than that of the insulating material in the thickness direction. The interlayer connection of the interlayer connection material is formed at a temperature higher than the operating temperature (for example, 60° C. or less) of the multilayer printed wiring board. This causes a difference in the coefficient of thermal expansion between the different materials in the thickness direction of the printed wiring board in the environment in which it is used. As a result, the internal stress allows the interlayer connecting portion to contract, thereby achieving a multilayer printed wiring board having high connection reliability.

INDUSTRIAL APPLICABILITY

The interlayer connection structure of the multilayer printed wiring board of the present invention provides high reliability of interlayer connection. Such multilayer printed wiring board is useful to the application relating to mounting substrates such as semiconductor packages and compact module components that are required to meet high reliability standards including minute wiring pattern and semiconductor packaging.

The invention claimed is:

1. A multilayer printed wiring board having a plurality of wiring layers, wherein
   interlayer connection material in a via hole has a coefficient of thermal expansion in a thickness direction lower than a coefficient of thermal expansion in a thickness direction of an electrically insulating substrate made of insulating material and
   the interlayer connection material is larger than the insulating material of a same wiring layer at the operating temperature in thickness; wherein
   both sides of the interlayer connection material in the via hole are completely covered by wiring members formed on the insulating substrate.

2. The multilayer printed wiring board of claim 1, wherein the insulating material is made of at least one of a composite of glass woven cloth and thermosetting resin; a composite of glass unwoven cloth and thermosetting resin; a composite of aramid woven cloth and thermosetting resin; and a composite of aramid unwoven cloth and thermosetting resin.

3. The multilayer printed wiring board of claim 2, wherein the thermosetting resin is an epoxy-based resin.

4. The multilayer printed wiring board of claim 1, wherein the thermoplastic resin has a glass transition temperature of at least 180° C.

5. The multilayer printed wiring board of claim 1 wherein the insulating material is made of a film material.

6. The multilayer printed wiring board of claim 1 wherein the interlayer connection material is formed by at least one of conductive pasting, conformal plating, filled plating, evaporating, and sputtering.

7. The multilayer printed wiring board of claim 1, wherein the coefficient of thermal expansion in the thickness direction of the electrically insulating substrate is from 40 to 70 ppm/° C.

* * * * *